(12) United States Patent
Tong et al.

(10) Patent No.: US 6,827,252 B2
(45) Date of Patent: Dec. 7, 2004

(54) BUMP MANUFACTURING METHOD

(75) Inventors: Ho-Ming Tong, Taipei (TW);
Chun-Chi Lee, Kaohsiung (TW);
Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 28 days.

(21) Appl. No.: 10/063,573

(22) Filed: May 3, 2002

(65) Prior Publication Data
US 2003/0155406 A1 Aug. 21, 2003

(30) Foreign Application Priority Data
Feb. 21, 2002 (TW) ........................................ 91102992 A

(51) Int. Cl.$^7$ ........................ B23K 31/00; B23K 31/02; H01L 23/48
(52) U.S. Cl. .............................. 228/180.22; 228/180.1; 228/180.21; 257/737
(58) Field of Search ........................... 228/180.1, 180.21, 228/180.22, 180.5, 4.5; 148/400; 427/96; 438/612–614, 106–108; 257/737, 738, 758, 761–766

(56) References Cited
U.S. PATENT DOCUMENTS

| 4,912,545 A | * | 3/1990 | Go | 257/737 |
|---|---|---|---|---|
| 5,251,806 A | * | 10/1993 | Agarwala et al. | 228/180.22 |
| 6,204,558 B1 | * | 3/2001 | Yanagida | 257/737 |
| 6,224,690 B1 | * | 5/2001 | Andricacos et al. | 148/400 |
| 6,281,106 B1 | * | 8/2001 | Higdon et al. | 438/613 |
| 6,300,250 B1 | * | 10/2001 | Tsai | 438/694 |
| 6,350,668 B1 | * | 2/2002 | Chakravorty | 438/612 |
| 6,372,622 B1 | * | 4/2002 | Tan et al. | 438/612 |
| 6,424,037 B1 | * | 7/2002 | Ho et al. | 257/738 |
| 6,455,785 B1 | * | 9/2002 | Sakurai et al. | 174/260 |
| 6,458,609 B1 | * | 10/2002 | Hikita et al. | 438/15 |
| 6,528,881 B1 | * | 3/2003 | Tsuboi | 257/738 |
| 2002/0064935 A1 | * | 5/2002 | Honda | 438/622 |
| 2003/0049886 A1 | * | 3/2003 | Salmon | 438/106 |
| 2003/0057559 A1 | * | 3/2003 | Mis et al. | 257/762 |
| 2003/0080431 A1 | * | 5/2003 | Uzoh et al. | 257/758 |
| 2003/0089758 A1 | * | 5/2003 | Lee | 228/4.5 |
| 2003/0099767 A1 | * | 5/2003 | Fang | 427/96 |
| 2003/0129821 A1 | * | 7/2003 | Weng | 438/612 |

* cited by examiner

*Primary Examiner*—L. Edmondson
(74) *Attorney, Agent, or Firm*—Jiang Chyun IP Office

(57) ABSTRACT

A method of forming bumps on the active surface of a silicon wafer. An under-ball metallic layer is formed over the active surface of the wafer. A plurality of first solder blocks is attached to the upper surface of the under-ball metallic layer. Each first solder block has an upper surface and a lower surface. The lower surface of each first solder block bonds with the under-ball metallic layer. The upper surfaces of the first solder blocks are planarized. A second solder block is attached to the upper surface of each first solder block and then a reflow operation is carried out.

39 Claims, 8 Drawing Sheets

BUMP MANUFACTURING METHOD

CROSS REFERENCE TO RELATED APPLICATIONS

This application claims the priority benefit of Taiwan application serial no. 91102992, filed Feb. 21, 2002.

BACKGROUND OF INVENTION

1. Field of Invention

The present invention relates to a method of manufacturing bumps. More particularly, the present invention relates to a bump manufacturing method capable of strengthening the bond between a solder block and a silicon wafer.

2. Description of Related Art

In this information explosion age, electronic products are used almost everywhere. Computer and processing stations driven by powerful integrated circuits are employed in offices, educational institutions, recreational industries, business and commercial companies. As electronic technology continues to progress, products having more powerful functions and more attuned to personal needs are developed. Furthermore, most electronic products are increasingly light and compact thanks to the efficient fabrication of many types of high-density semiconductor packages. A major innovation is the flip chip design capable of cramming a considerable number of integrated circuits together. In a flip-chip design, a plurality of bumps is formed on the bonding pads of a silicon chip. Each bump directly contacts a corresponding contact point on a substrate so that the chip and the substrate are electrically connected. Compared with conventional wire bonding and tape automated bonding (TAB) methods of joining a chip with a substrate, the flip-chip design has a shorter overall conductive path and hence a better electrical connectivity. In addition, the backside of the chip may be exposed to facilitate heat dissipation during operation. Due to the distinguishing advantages of flip-chip packages, semiconductor manufacturing favors its production.

FIGS. 1 to 4 are partially magnified cross-sectional views showing the steps for forming bumps on a silicon wafer according to a convention method. As shown in FIG. 1, a silicon wafer 110 having an active surface 112 is provided. The wafer 110 also has a passivation layer 114 and a plurality of bonding pads 116 (only one is shown) over the active surface 112 of the wafer 110. The passivation layer 114 exposes the bonding pads 116. A conventional stud-forming machine is used to form a first solder block 120 over each solder pad 116. The first solder blocks 120 are made from a material such as copper or gold. The upper surfaces 122 of the first solder blocks 120 are planarized to form a structure as shown in FIG. 2.

As shown in FIG. 3, a conventional wire-bonding machine is used to attach a second solder block 130 to the upper surface of the first solder block 120. The second solder blocks 130 are made from a material such as lead-tin alloy. A reflow operation is carried out sprinkling a flux material over the wafer and heating the wafer. The heat softens the second solder blocks 130 and transforms the second solder blocks 130 into blobs of material having a hemispherical profile as shown in FIG. 4. This completes the fabrication of a bump 140 (only one is shown) comprising one first solder block 120 and one second solder block 130.

In the aforementioned fabrication process, the first solder block 120 directly bonds with the bonding pad 116. Hence, the first solder block 120 and the bonding pad 116 must have good bondability. However, not every type of material constituting the first solder block 120 has the capacity to wet the bonding pad 116 material. Thus, there is limitation in the selection of material forming the first solder blocks 120. Improper selection of first solder block material may result in the formation of a weak bond with the bonding pads 116. Furthermore, some of the first solder block material such as copper has great diffusion capacity. Such metallic particles may diffuse into the wafer forming unwanted conductive circuits between metallic interconnects inside the wafer. In some cases, the chip may fail because of this, leading to a lower production yield.

SUMMARY OF INVENTION

Accordingly, one object of the present invention is to provide a method of forming bumps over a silicon wafer such that an additional under-ball metallic layer is formed between a bonding pad on the wafer and a first solder block. Hence, ultimate adhesive strength of the bump with corresponding bonding pad is increased.

A second object of this invention is to provide a method of forming bumps over a silicon wafer such that an additional under-ball metallic layer is formed between a bonding pad on the wafer and a first solder block. Hence, the diffusion of metallic particles inside the bump into the wafer is prevented and the probability of chip failure due to short circuit is reduced.

Note in the following description that the use of the preposition "over" as in "a second layer is formed over a first layer" means that the second layer is either in contact with the first layer or simply above the first layer.

To achieve these and other advantages and in accordance with the purpose of the invention, as embodied and broadly described herein, the invention provides a method of forming a plurality of bumps over a silicon wafer. The wafer has an active surface with a passivation layer and a plurality of bonding pads thereon. The passivation layer exposes the bonding pads. First, an adhesion layer is formed over the active surface of the wafer covering the bonding pads and the passivation layer. A barrier layer is formed over the adhesion layer. A wettable layer is formed over the barrier layer.

A photolithographic process is conducted to from a plurality of photoresist blocks over the wettable layer. A first etching operation is carried out to remove the wettable layer, the barrier layer and the adhesion layer outside the photoresist blocks so that only the wettable layer, the barrier layer and the adhesion layer underneath the photoresist blocks remain. The photoresist blocks are removed.

A first solder block bonds onto the wettable layer through a bonding operation. Each first solder block has an upper surface and a lower surface. The lower surface of the first solder block bonds with the wettable layer. The upper surface of the first solder block is planarized through polishing. Thereafter, a second solder block bonds onto the upper surface of the first solder block through another bonding operation. A reflow operation is next carried out.

According to the embodiment of this invention, the adhesion layer can be made from a material including titanium, titanium-tungsten alloy, aluminum or chromium. The barrier layer can be made from a material including nickel-vanadium alloy, chromium-copper alloy or nickel. The first solder block can be made from a material including lead-tin alloy, tin-silver alloy, tin-silver-copper alloy, silver or gold. The second solder block can be made from a material including lead-tin alloy, tin-silver alloy, tin-silver-copper alloy or tin.

In addition, after bonding a second solder block onto a first solder block, the upper surface of the second solder block may be planarized through polishing. The reflow operation is carried out after the planarization. However, the process of planarizing the upper surface of the second solder block can also be omitted entirely.

In brief, because the first solder block is bonded onto the wettable layer, a material capable of wetting the first solder block may be chosen as the material constituting the wettable layer. Hence, the first solder blocks are tightly coupled to the wafer. The under-ball metallic layer may be designed according to the material constituting the first solder blocks so that solder blocks of whatever material can attach firmly to the active surface of the wafer. Furthermore, through the placement of an under-ball metallic layer, diffusion of metallic particles from the solder block to the wafer is blocked. Hence, the diffusion of metallic particles into the insulation layer of the wafer leading to chip failure is greatly minimized. Moreover, different types of materials may be used to form the first solder blocks and the second solder blocks and the volume of material forming the first solder blocks and the second solder blocks may be tailor-made by controlling the settings of a wire-bonding machine. The bulk of the first solder blocks and the second solder blocks can further be controlled through polishing so that solder blocks having a variety of ratios are possible.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
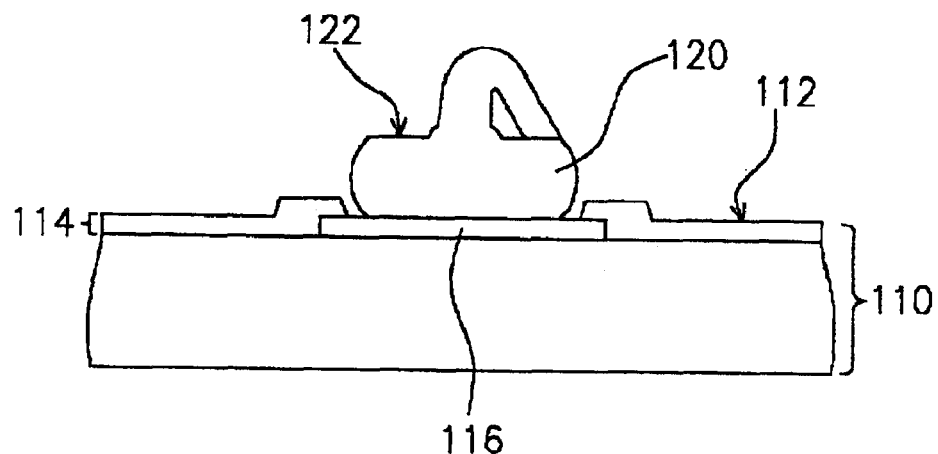
FIGS. 1 to 4 are partially magnified cross-sectional views showing the steps for forming bumps on a silicon wafer according to a convention method.
Figure 2:
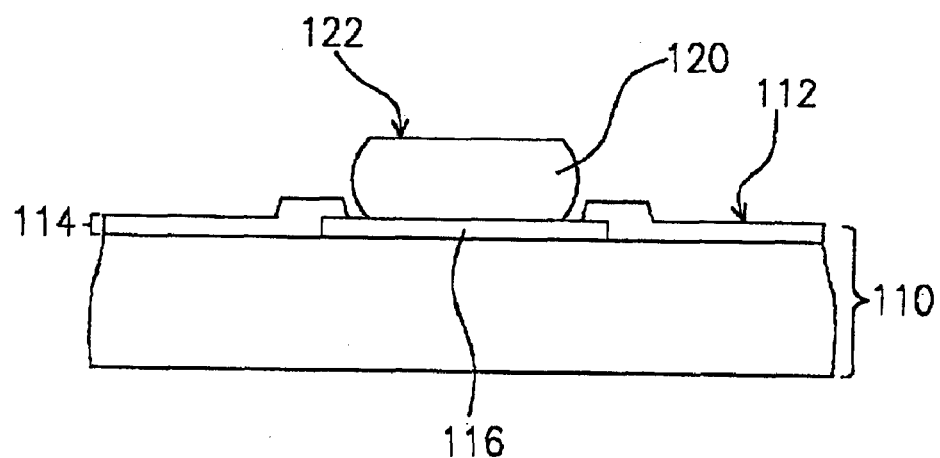
Figure 3:
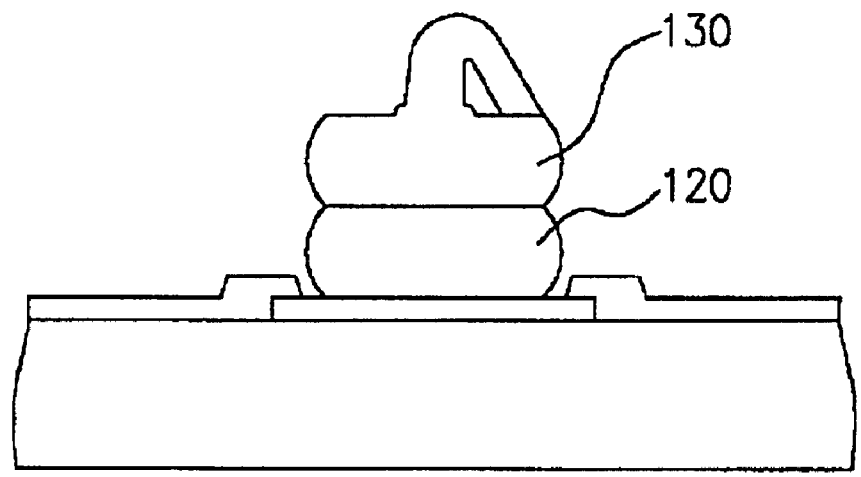
Figure 4:
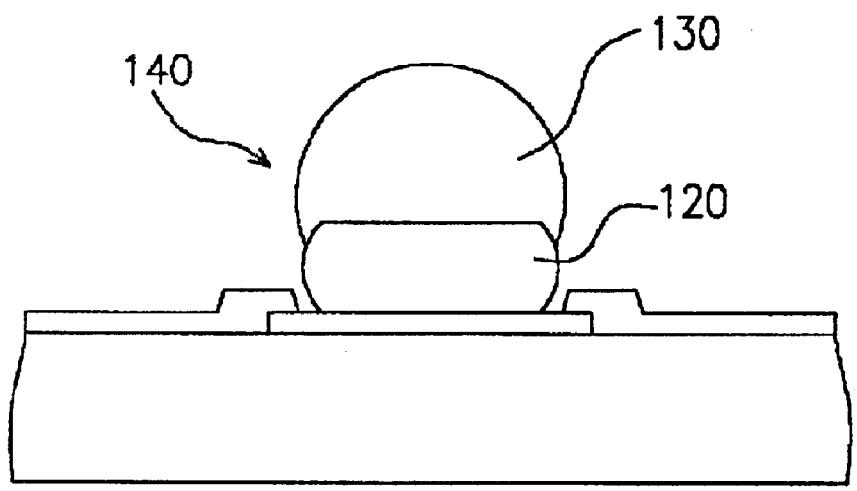

Reference will now be made in detail to the present preferred embodiments of the invention, examples of which are illustrated in the accompanying drawings. Wherever possible, the same reference numbers are used in the drawings and the description to refer to the same or like parts.

Figure 5:
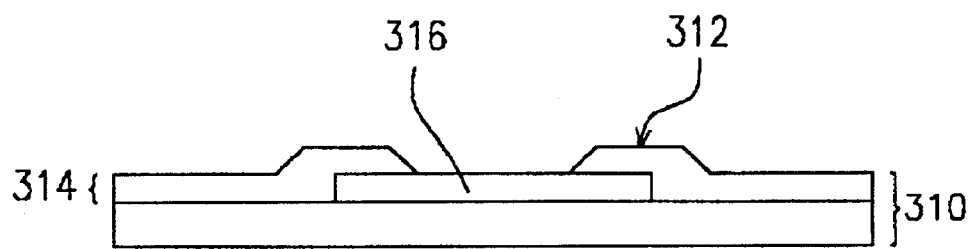
FIGS. 5 to 16 are partially magnified cross-sectional views showing the steps for forming bumps on a silicon wafer according to one preferred embodiment of this invention.

FIGS. 5 to 16 are partially magnified cross-sectional views showing the steps for forming bumps on a silicon wafer according to one preferred embodiment of this invention. As shown in FIG. 5, a silicon wafer 310 having an active surface 312 with a passivation layer 314 and a plurality of bonding pads 316 (only one is shown) thereon is provided. The passivation layer 314 exposes the bonding pads 316.

Figure 6:
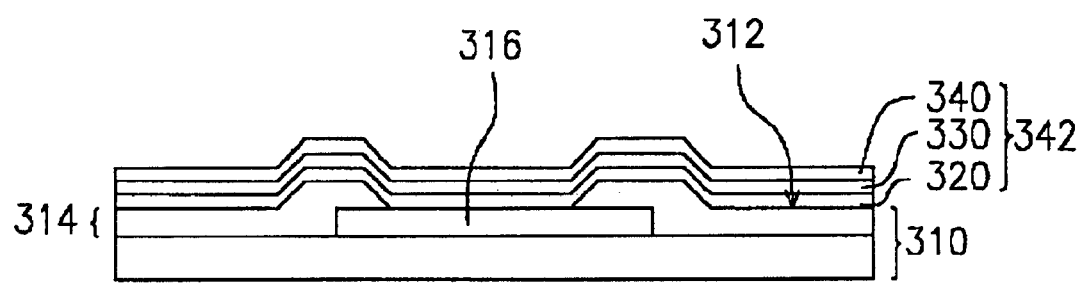

As shown in FIG. 6, an adhesion layer 320 is formed over the active surface 312 of the wafer 310 by sputtering. The adhesion layer 320 covers both the bonding pads 316 and the passivation layer 314. The adhesion layer is made from a material such as titanium, titanium-tungsten alloy, aluminum and chromium. A barrier layer 330 is formed over the adhesion layer 320 by sputtering or electroplating. The barrier layer 330 is made from a material such as nickel-vanadium alloy, chromium-copper alloy or nickel. A wettable layer 340 is formed over the barrier layer 330 by sputtering or electroplating. The wettable layer 340 is made from a material such as copper, palladium or gold. This completes the fabrication of an under-ball metallic layer 342. The under-ball metallic layer 342 actually comprises the one adhesion layer 320, one barrier layer 330 and one wettable layer 340.

Figure 7:
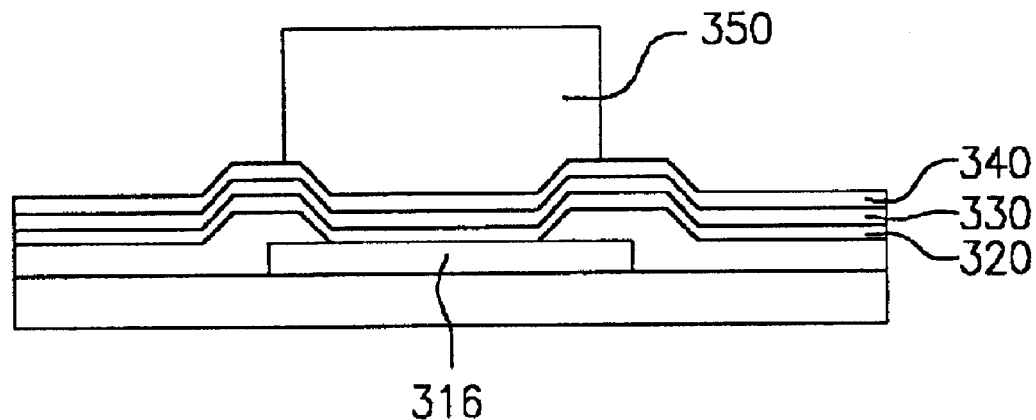
Figure 8:
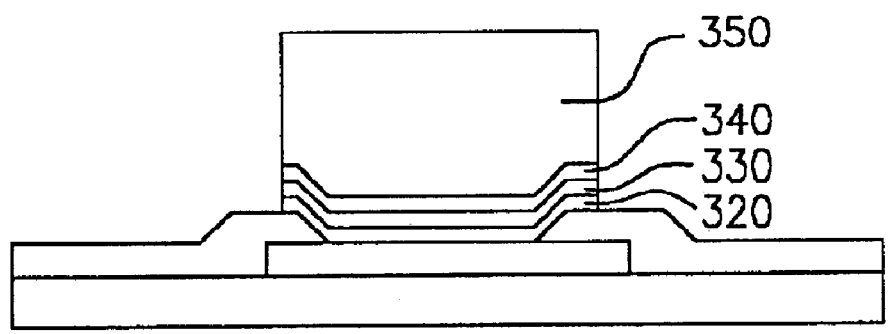
Figure 9:
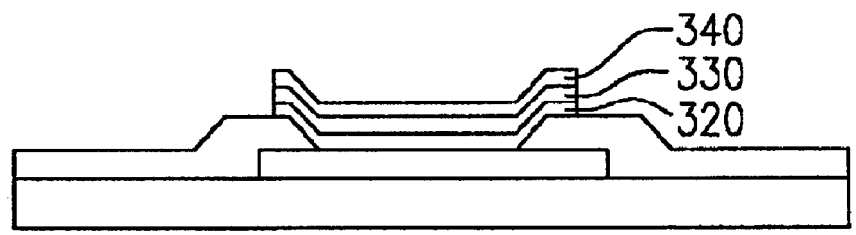

As shown in FIG. 7, a photolithographic process is carried out to form a photoresist layer over the wettable layer 340. The photoresist layer is exposed to light and chemically developed to transfer a pattern (not shown) to the photoresist layer. Hence, a plurality of photoresist blocks 350 (only one is shown) is formed in locations where bumps need to be formed. In fact, the photoresist blocks 350 are formed directly over the bonding pads 316. An etching operation is conducted to removed the exposed wettable layer 340, the barrier layer 330 and the adhesion layer 320 so that only the wettable layer 340, the barrier layer 330 and the adhesion layer 320 underneath the photoresist blocks 350 remain as shown in FIG. 8. The photoresist blocks 350 are removed to form a structure as shown in FIG. 9.

Figure 10:
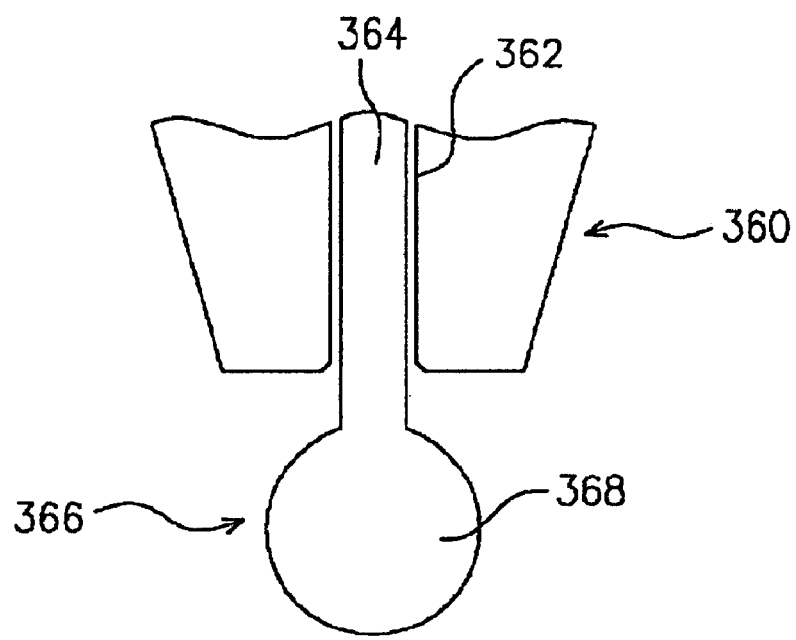
Figure 10:
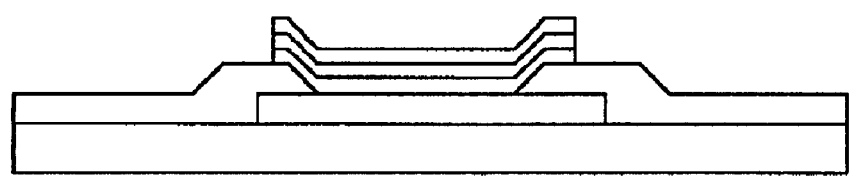

As shown in FIG. 10, a first solder block is formed on each bonding pad 316 of the wafer 310. A conventional stud-forming machine is used to conduct the bonding operation. The stud-forming machine has a wire-bonding head 360 with a capillary channel 362 for accommodating a conductive wire 364. The conductive wire 364 is free to slide inside the capillary channel 362. A spike discharge method is used to generate heat at one end 366 of the conductive wire 364 so that the wire 364 partially melts. Through the inward pull of metallic ions, the heated end of the wire forms a spherical blob 368. While the spike discharge operation is carried out, the end of the conductive wire 364 is immersed in an inert atmosphere so that the heated blob 368 is prevented from oxidation.

Figure 11:
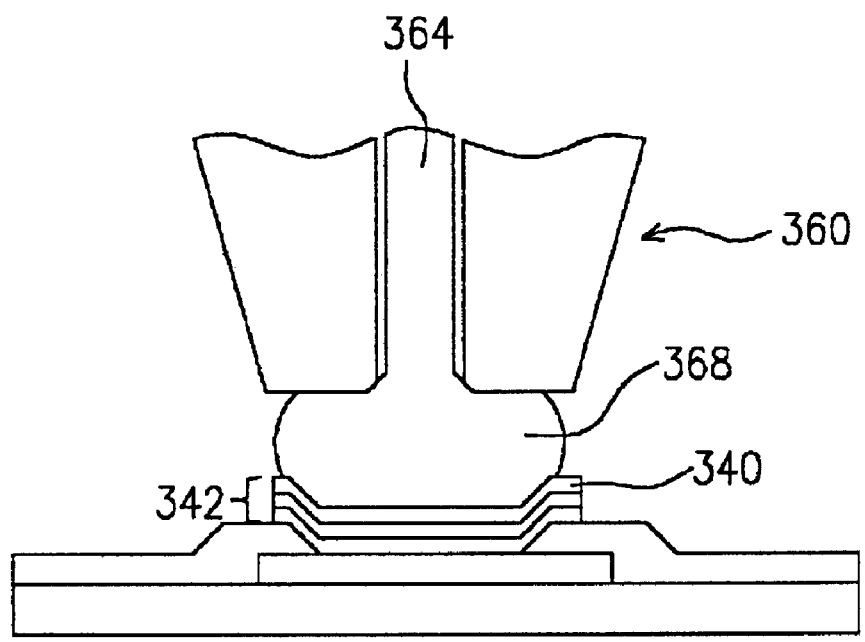
Figure 12:
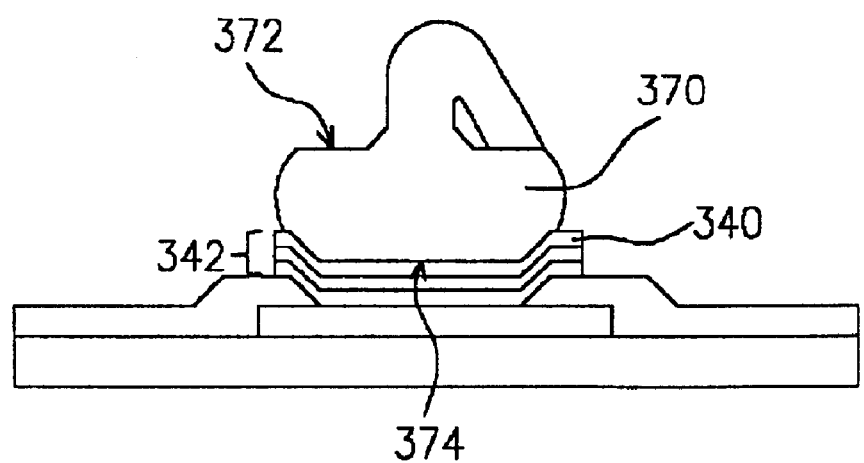
Figure 13:
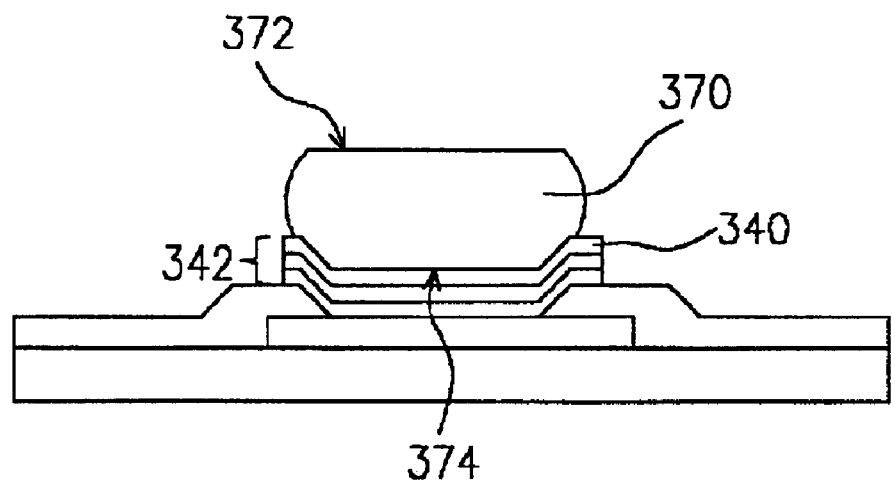

As shown in FIG. 11, the material blob 368 at the end of the conductive wire 364 moves down and contacts the wettable layer 340 before the blob 368 solidifies. Ultrasound is also applied concurrently to assist the joining of the spherical block 368 with the wettable layer 340. The spherical blob 368 and the wettable layer 340 wet each other so that the spherical blob 368 is firmly attached to the under-ball metallic layer 342. Thereafter, the wire-bonding head 360 is raised so that the conductive wire 364 detaches from the spherical blob 368 to form a structure as shown in FIG. 12. This completes the attachment of the first solder blocks 370 (only one is shown). The first solder block 370 has an upper surface 372 and a lower surface 374. The lower surface 374 of the first solder block 370 bonds with the wettable layer 340. The first solder blocks 370 are made from a material such as 63Sn/37Pb lead-tin alloy, 90Pb/10Sn lead-tin alloy, 95Pb/5Sn lead-tine alloy, 97Pb/3Sn lead-tin alloy, 95Sn/5Ag tin-silver alloy, 97.5Sn/2Ag/0.5Cu tin-silver-copper alloy, 96.5Sn/3.5Ag tin-silver alloy, silver or gold. A polishing operation or a pressurizing operation is conducted to planarize the upper surface 372 of the first solder block 370 so that the upper surface 372 of the first solder block 370 becomes planar as shown in FIG. 13. Through the polishing operation, volume of first solder block material on the under-ball metallic layer can be controlled.

Figure 14:
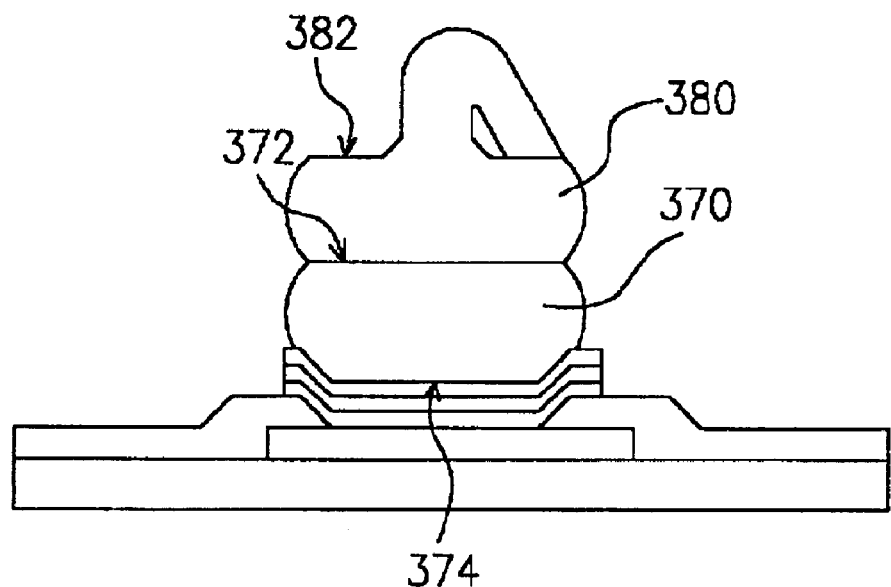

As shown in FIG. 14, a second wire-bonding operation is conducted to form a plurality of second solder blocks 380

Figure 15:
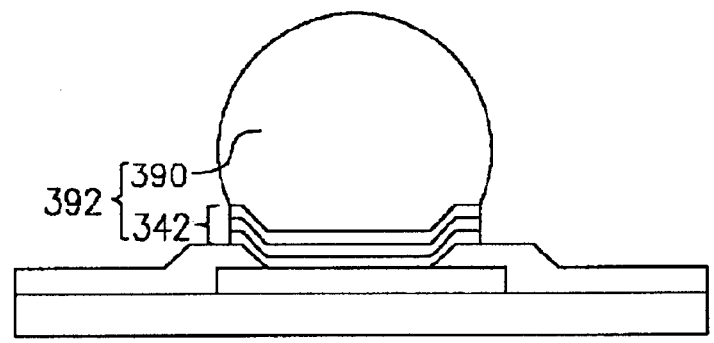
Figure 16:
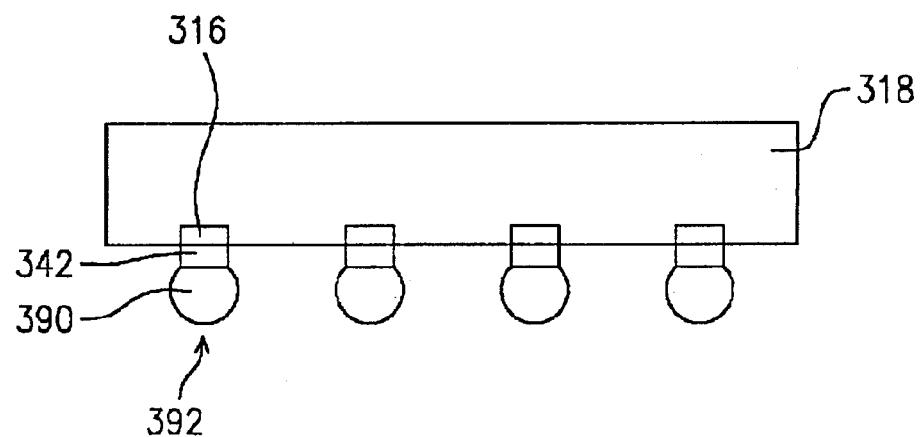

(only one is shown) on the upper surface 372 of various first solder blocks 370. A method similar to the one forming the first solder blocks 370 is used and hence detailed description is omitted. The second solder blocks 380 are made from a material such as 63Sn/37Pb lead-tin alloy, 90Pb/10Sn lead-tin alloy, 95Pb/5Sn lead-tine alloy, 97Pb/3Sn lead-tin alloy, 95Sn/5Ag tin-silver alloy, 97.5Sn/2Ag/0.5Cu tin-silver-copper alloy, 96.5Sn/3.5Ag tin-silver alloy or tin. A reflow operation is carried out sprinkling flux material over the wafer 310 and heating the wafer so that the first solder blocks 370 and the second solder blocks 380 melt together to form solder blocks 390 (only one is shown). Therefore, a set of bumps 392 (only one is shown) each comprising one solder block 390 and one under-ball metallic layer 342 having a structure shown in FIG. 15 is formed. Note that the reflow temperature must be higher than the alloying temperature between the first solder block 370 and the second solder block 380. Finally, the wafer 310 is sliced up into a plurality of chips 318 as show in FIG. 16.

In the aforementioned processes, the first solder block 370 is attached to the wettable layer 340. Hence, as long as the wettable layer 340 is made from a material capable of wetting the first solder blocks 370, the first solder blocks 370 are firmly attached to the wafer 310. Furthermore, the under-ball metallic layer 342 may be designed according to the material selected to form the first solder blocks 370. In this way, the solder blocks 370 are able to hold firmly to the active surface 312 of the wafer 310 whatever the type of material constituting the solder blocks 370. In addition, the under-ball metallic layer 342 serves also as a barrier blocking the diffusion of metallic particles into the insulation layer inside the wafer 310 that may lead to chip failure.

The first solder blocks 370 and the second solder blocks 380 can be fabricated using a different material. For example, the first solder blocks 370 are all made from 63Sn/37Pb lead-tin alloy while the second solder blocks 380 are all made from 97Pb/3Sn lead-tin alloy. Consequently, a lead-tin alloy having a specified lead/tin ratio such as 70Pb/20Sn may be produced after a reflow operation. Therefore, lead-tin alloy of various ratios may be produced in this way. Moreover, the aforementioned processes can also be applied to the fabrication of lead free bumps. For example, silver is used to form the first solder blocks 370 while tin is used to form the second solder blocks 380. Thus, a tin-silver alloy having a specified tin/silver ratio such as 95Sn/5Ag may be produced after a reflux operation. Hence, tin-silver alloy of various ratios may be produced as well.

Furthermore, the upper surface 382 of the second solder blocks 380 may be polished to obtain a planar top. Through the polishing operation, volume of second solder block material on top of the first solder block 370 may also be modified. in fact, volume of material constituting the first solder blocks 370 and the second solder blocks 380 can be precisely controlled through separate polishing of the upper surface 372 of the first solder blocks 370 and the upper surface 382 of the second solder blocks 380 respectively. Thus, the metallic composition of the bumps 390 after the reflow operation can be precisely controlled. In general, aside from the wire-bonding operations, volume of material in each first solder block 370 and second solder block 380 can be precisely controlled through polishing to produce bumps having a different compositional ratio.

The smallest distance of separation capable of being produced by a wire-bonding machine is currently down to 40 µm. Accordingly, minimum distance of separation between neighboring bumps 392 permissible is also about the same magnitude.

In general, other types of under-ball metallic material may be used in the fabrication of the bumps aside from the aforementioned materials. Moreover, the bonding pads may be made from a material such as aluminum or copper.

The under-ball metallic layer according to this invention need not be limited to just three layers (the adhesion layer, the barrier layer and the wettable layer). Other number of conductive layers is possible. For example, the under-ball metallic layer can be a structure with four layers, including a chromium layer, a chromium-copper alloy layer, a copper layer and a silver layer. Alternatively, the under-ball metallic layer can be a structure with two layers, including a lower layer such as a titanium-tungsten alloy layer or a titanium layer and an upper layer such as a copper layer, a nickel layer or a gold layer.

In addition, the wafer may be sliced up before attaching the first solder blocks and the second solder blocks onto the active surface in a wire-bonding operation and performing a reflow operation. Furthermore, the first solder blocks may bond with the under-ball metallic layer immediately after forming the under-ball metallic layer. Thereafter, the under-ball metallic layer is etched using the first solder blocks as an etching mask. With this arrangement, one photolithographic step is saved.

Although the bumps are directly formed on the active surface of a silicon wafer in the aforementioned embodiments, the bumps may also form elsewhere. For example, the bumps may form over a redistribution layer after the redistribution layer is formed on a silicon wafer.

In conclusion, the method of forming bumps on a wafer according to this invention has at least the following advantages:

1. The first solder block is attached to the wettable layer. Hence, as long as the wettable layer is made from a material capable of wetting the first solder blocks, the first solder blocks are firmly attached to the wafer. Furthermore, the under-ball metallic layer may be designed according to the material selected to form the first solder blocks. In this way, the solder blocks are able to hold firmly to the active surface of the wafer whatever the type of material constituting the solder blocks.

2. The under-ball metallic layer serves also as a barrier blocking the diffusion of metallic particles into the insulation layer inside the wafer. Hence, chip failure due to short circuit is prevented.

3. Different types of material may be employed to form the first solder blocks and the second solder blocks and volume of material used by each type of solder blocks may be precisely controlled. Hence, bumps having any type of compositional ratio may be produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming bumps on a silicon wafer having an active surface with a passivation layer and a plurality of bonding pads thereon, wherein the passivation layer exposes the bonding pads, the method comprising the steps of:

forming an adhesion layer over the active surface of the wafer, wherein the adhesion layer covers both the bonding pads and the passivation layer;

forming a barrier layer over the adhesion layer;

forming a wettable layer over the barrier layer;

conducting a photolithographic process to form a plurality of photoresist blocks over the wettable layer;

conducting an etching operation to remove the wettable layer, the barrier layer and the adhesion layer outside the photoresist blocks so that only the wettable layer, the barrier layer and the adhesion layer underneath the photoresist blocks remain;

removing the photoresist blocks;

attaching a plurality of first solder blocks to the upper surface of the wettable layer through a bonding operation, wherein each first solder block has an upper surface and a lower surface such that the lower surface of the first solder block bonds with the wettable layer;

planarizing the upper surface of the first solder blocks;

attaching a second solder block to the upper surface of each first solder block through a bonding operation; and alloying the first solder block and the second solder block to attain a single solder bump.

2. The method of claim 1, wherein material constituting the adhesion layer is selected from a group consisting of titanium, titanium-tungsten alloy, aluminum and chromium.

3. The method of claim 1, wherein material constituting the barrier layer is selected from a group consisting of nickel-vanadium alloy, chromium-copper alloy and nickel.

4. The method of claim 1, wherein material constituting the wettable layer is selected from a group consisting of copper, palladium and gold.

5. The method of claim 1, wherein each second solder block includes an upper surface and a lower surface, the lower surface is in contact with the upper surface of the first solder block, and the upper surface of the second solder block is planarized by polishing.

6. The method of claim 1, wherein material constituting the first solder blocks is selected from the group consisting of lead-tin alloy, lead-silver alloy, tin-silver alloy, silver and gold.

7. The method of claim 1, wherein material constituting the second solder blocks is selected from the group consisting of lead-tin alloy, tin-silver alloy, tin-silver-copper alloy and tin.

8. The method of claim 1, wherein the step of planarizing the upper surface of the first solder blocks includes polishing.

9. The method of claim 1, wherein the step of planarizing the upper surface of the first solder blocks includes applying a pressure.

10. The method of claim 1, wherein the step of attaching a first solder block to the wettable layer includes the sub-steps of:

providing a conductive wire;

heating one end of the conductive wire so that the heated end of the conductive wire transforms into a spherical blob;

pulling the spherical blob towards the wettable layer and pressing the spherical blob against the surface of the wettable layer; and detaching the remaining portion of the conductive wire from the spherical blob to form the first solder block.

11. The method of claim 10, wherein the step of pressing the spherical blob against the wettable layer is further assisted by application of ultrasound.

12. The method of claim 1, wherein the step of attaching a second solder block to a first solder block further includes the sub-steps of:

providing a conductive wire;

heating one end of the conductive wire so that the heated end of the conductive wire transforms into a spherical blob;

pulling the spherical blob towards the first solder block and pressing the spherical blob against the upper surface of the first solder block; and detaching the remaining portion of the conductive wire from the spherical blob to form the second solder block.

13. The method of claim 12, wherein the step of pressing the spherical blob against the first solder block is further assisted by an application of ultrasound.

14. A method of forming bumps on an active surface of a silicon wafer, the method comprising the steps of:

forming an under-ball metallic layer over the active surface of the wafer, wherein the under-ball metallic layer is a composite layer;

removing a portion of the under-ball metallic layer to expose the active surface of the wafer;

attaching a plurality of first solder blocks to an upper surface of the under-ball metallic layer, wherein each first solder block has an upper surface and a lower surface such that the lower surface of each first solder block bonds with the under-ball metallic layer;

planarizing the upper surface of the first solder blocks;

attaching a second solder block to the upper surface of each first solder block; and transforming the first solder block and the second solder block into a single integral solder bump alloy, wherein the solder bump alloy has a specified composition ratio of a material that constitutes the first solder block to a material that constitutes the second solder block.

15. The method of claim 14, wherein the step of forming an under-ball metallic layer over the active surface of the wafer includes the sub-steps of:

forming an adhesion layer over the active surface of the wafer;

forming a barrier layer over the adhesion layer; and forming a wettable layer over the barrier layer.

16. The method of claim 15, wherein material constituting the adhesion layer is selected from a group consisting of titanium, titanium-tungsten alloy, aluminum and chromium.

17. The method of claim 15, wherein material constituting the barrier layer is selected from a group consisting of nickel-vanadium alloy, chromium-copper alloy and nickel.

18. The method of claim 15, wherein material constituting the wettable layer is selected from a group consisting of copper, palladium and gold.

19. The method of claim 14, wherein each second solder block includes an upper surface and a lower surface, the lower surface is in contact with the upper surface of the first solder block, and the upper surface of the second solder block is planarized by polishing.

20. The method of claim 14, wherein the material constituting the first solder blocks is selected from the group consisting of lead-tin alloy, lead-silver alloy, tin-silver alloy, silver and gold.

21. The method of claim 14, wherein the material constituting the second solder blocks is selected from the group consisting of lead-tin alloy, tin-silver alloy, tin-silver-copper alloy and tin.

22. The method of claim 14, wherein the step of planarizing the upper surface of the first solder blocks includes polishing.

23. The method of claim 14, wherein the step of planarizing the upper surface of the first solder blocks includes applying a pressure.

24. The method of claim 14, wherein the step of attaching a first solder block to the under-ball metallic layer includes the sub-steps of:

providing a conductive wire;

heating one end of the conductive wire so that the heated end of the conductive wire transforms into a spherical blob;

pulling the spherical blob towards the under-ball metallic layer and pressing the spherical blob against the surface of the under-ball metallic layer; and detaching the remaining portion of the conductive wire from the spherical blob to form the first solder block.

25. The method of claim 24, wherein the step of pressing the spherical blob against the under-ball metallic layer is further assisted by application of ultrasound.

26. The method of claim 14, wherein the step of attaching a second solder block to a first solder block further includes the sub-steps of:

providing a conductive wire;

heating one end of the conductive wire so that the heated end of the conductive wire transforms into a spherical blob;

pulling the spherical blob towards the first solder block and pressing the spherical blob against the upper surface of the first solder block; and detaching the remaining portion of the conductive wire from the spherical blob to form the second solder block.

27. The method of claim 26, wherein the step of pressing the spherical blob against the first solder block is further assisted by application of ultrasound.

28. A method of forming bumps on the active surface of a silicon wafer, wherein the active surface further includes an under-ball metallic layer thereon and the under-ball metallic layer is a composite layer that comprises a plurality of material layers, the method comprising the steps of:

attaching at least one first solder block to an upper surface of the under-ball metallic layer by conducting a bonding operation;

attaching at least one second solder block to the upper surface of the first solder block by conducting a bonding operation; and alloying at least one of the first solder block and at least one of the second solder block into at least one single solder bump.

29. The method of claim 28, wherein after the step of attaching the first solder block to the upper surface of the under-ball metallic layer, further includes planarizing the upper surface of the first solder block and attaching a second solder block to the upper surface of the first solder block by conducting a bonding operation.

30. The method of claim 29, wherein the step of planarizing the upper surface of the first solder block includes polishing.

31. The method of claim 29, wherein the step of planarizing the upper surface of the first solder block include pressing.

32. The method of claim 28, wherein after the step of attaching the second solder block to the upper surface of the first solder block, further includes planarizing the upper surface of the second solder block.

33. The method of claim 32, wherein the step of planarizing the upper surface of the second solder blocks includes polishing.

34. The method of claim 28, wherein material constituting the first solder blocks is selected from the group consisting of lead-tin alloy, lead-silver alloy, tin-silver alloy, silver and gold.

35. The method of claim 28, wherein material constituting the second solder blocks is selected from the group consisting of lead-tin alloy, tin-silver alloy, tin-silver-copper alloy and tin.

36. The method of claim 28, wherein the step of attaching a first solder block to the under-ball metallic layer includes the sub-steps of:

providing a conductive wire;

heating one end of the conductive wire so that the heated end of the conductive wire transforms into a spherical blob;

pulling the spherical blob towards the under-ball metallic layer and pressing the spherical blob against the surface of the under-ball metallic layer; and detaching the remaining portion of the conductive wire from the spherical blob to form the first solder block.

37. The method of claim 36, wherein the step of pressing the spherical blob against the under-ball metallic layer is further assisted by application of ultrasound.

38. The method of claim 28, wherein the step of attaching a second solder block to a first solder black further includes the sub-steps of:

providing a conductive wire;

heating one end of the conductive wire so that the heated end of the conductive wire transforms into a spherical blob;

pulling the spherical blob towards the first solder block and pressing the spherical blob against the upper surface of the first solder block; and detaching the remaining portion of the conductive wire from the spherical blob to form the second solder block.

39. The method of claim 38, wherein the step of pressing the spherical blob against the first solder block is further assisted by application of ultrasound.

* * * * *